United States Patent
Bethoux et al.

(10) Patent No.: US 12,040,424 B2
(45) Date of Patent: Jul. 16, 2024

(54) METHOD FOR MANUFACTURING A GROWTH SUBSTRATE

(71) Applicant: Soitec, Bernin (FR)

(72) Inventors: Jean-Marc Bethoux, La Buisse (FR); Mariia Rozhavskaia, Grenoble (FR)

(73) Assignee: Soitec, Bernin (FR)

(*) Notice: Subject to any disclaimer, the term of this patent is extended or adjusted under 35 U.S.C. 154(b) by 388 days.

(21) Appl. No.: 17/416,854

(22) PCT Filed: Nov. 29, 2019

(86) PCT No.: PCT/FR2019/052855
§ 371 (c)(1),
(2) Date: Jun. 21, 2021

(87) PCT Pub. No.: WO2020/128184
PCT Pub. Date: Jun. 25, 2020

(65) Prior Publication Data
US 2022/0059720 A1    Feb. 24, 2022

(30) Foreign Application Priority Data
Dec. 21, 2018 (FR) ...................................... 1873889

(51) Int. Cl.
*H01L 33/00* (2010.01)
*H01L 33/12* (2010.01)
*H01L 33/18* (2010.01)

(52) U.S. Cl.
CPC .......... *H01L 33/0075* (2013.01); *H01L 33/12* (2013.01); *H01L 33/18* (2013.01)

(58) Field of Classification Search
CPC ..... H01L 33/0075; H01L 33/12; H01L 33/18; H01L 33/0066; H01L 33/0093;
(Continued)

(56) References Cited

U.S. PATENT DOCUMENTS

| 5,719,895 A | 2/1998 | Jewell et al. |
| 2005/0236642 A1 | 10/2005 | Sakai et al. |
| 2014/0084241 A1* | 3/2014 | Okuno ................... H01L 33/06 438/47 |

FOREIGN PATENT DOCUMENTS

| CN | 101834245 A | 9/2010 |
| CN | 103715071 A | 4/2014 |

(Continued)

OTHER PUBLICATIONS

International Search Report for International Application No. PCT/FR2019/052855 dated Jan. 31, 2020, 2 pages.
(Continued)

*Primary Examiner* — Tucker J Wright
(74) *Attorney, Agent, or Firm* — TraskBritt

(57) ABSTRACT

A process for fabricating a growth substrate comprises preparing a donor substrate by forming a crystalline semiconductor surface layer on a seed layer of a carrier. This preparation comprises forming the surface layer as a plurality of alternations of an InGaN primary layer and of an AlGaN secondary layer, the indium concentration and the thickness of the primary layers and the aluminum concentration and the thickness of the secondary layers being selected so that a homogeneous AlInGaN layer that is equivalent, in terms of concentration of aluminum and indium, to the surface layer has a natural lattice parameter different from the lattice parameter of the seed layer.

11 Claims, 2 Drawing Sheets

(58) Field of Classification Search
CPC ......... H01L 21/02458; H01L 21/02507; H01L 21/0254; H01L 21/76254; H01L 21/76251; H01L 21/18
See application file for complete search history.

(56) References Cited

FOREIGN PATENT DOCUMENTS

| | | |
|---|---|---|
| TW | 201201401 A | 1/2012 |
| TW | 201730974 A | 9/2017 |
| WO | 2018/158529 A1 | 9/2018 |

OTHER PUBLICATIONS

International Written Opinion for International Application No. PCT/FR2019/052855 dated Jan. 31, 2020, 5 pages.
Jahnen et al., Pinholes, Dislocations and Strain Relaxation in InGaN, Materials, Research Society Internet journal of Nitride Semiconductor Research, vol. 3, (1998), 22 pages.
Chinese *First Office Action for Chinese Application No. 201980083618.X, dated Dec. 18, 2023, 5 pages with translation.
Chinese Search Report for Chinese Application No. 201980083618.X, dated Dec. 11, 2023, 3 pages.
Taiwanese Office Action and Search Report for Application No. 11220727020 dated Jul. 26, 2023, 6 pages.

* cited by examiner

METHOD FOR MANUFACTURING A GROWTH SUBSTRATE

CROSS-REFERENCE TO RELATED APPLICATIONS

This application is a national phase entry under 35 U.S.C. § 371 of International Patent Application PCT/FR2019/052855, filed Nov. 29, 2019, designating the United States of America and published as International Patent Publication WO 2020/128184 A1 on Jun. 25, 2020, which claims the benefit under Article 8 of the Patent Cooperation Treaty to French Patent Application Serial No. 1873889, filed Dec. 21, 2018.

TECHNICAL FIELD

The present disclosure relates to a substrate for growing a semiconductor structure and to a process for fabricating such a substrate.

BACKGROUND

Fabricating processes that aim to form at least partially relaxed crystalline InGaN growth islands on a carrier are known from documents EP2151852 and EP2151856. The growth islands have an indium concentration between 5% and 7% for a thickness of about 100 nm.

Referring to FIG. 3a, these methods firstly comprise preparing a donor substrate 10 comprising a surface layer 12 of compressively strained InGaN on a GaN seed layer 14 formed on a donor carrier 16. Next, as shown in FIG. 3b, at least one portion of the surface layer 12 is transferred to a relaxation substrate 18, with a creep layer 20 inserted between the transferred InGaN layer 12 and the relaxation substrate 18. In these methods, growth islands 22 are defined in the surface layer 12 as shown in FIG. 3c, and a heat treatment is applied to at least partially relax these islands as shown in FIG. 3d. As shown in FIG. 3e, the growth islands 22 may be transferred to a final carrier 24, a dielectric layer 26 being located between the growth islands 22 and the final carrier 24. The relaxation substrate 18 and at least a portion of the creep layer 20 then may be removed to expose the growth islands 22 over the final carrier 24, as shown in FIG. 3f.

At the end of this process, the InGaN growth islands have a lattice parameter suitable for the growth of a semiconductor optoelectronic structure, this lattice parameter not being achievable, in volume and at a reasonable cost, with a bulk material. The semiconductor structure may, for example, correspond to a light-emitting diode (LED), a laser diode, or a photovoltaic cell.

Such a semiconductor optoelectronic structure, a light-emitting diode (LED), for example, comprises a stack of crystalline semiconductor layers including at least one active layer, i.e., a layer that has optoelectronic properties. An LED active layer may comprise, as is well known per se, a repeated alternation of a barrier layer and of a layer forming a quantum well. The indium content of an InGaN quantum-well layer may be of the order of 10% to form diodes emitting in the blue, higher than about 20% when the diode emits in the green, and higher than about 40% for a diode emitting in the red. The barrier layer has a lower indium content than the quantum-well layer.

The higher the indium content, the higher the natural lattice parameter (i.e., the lattice parameter of a perfectly relaxed layer) of the quantum-well layer. In other words, the higher the indium content, the more the quantum-well layer is compressively strained when it is formed on a growth carrier having a given lattice parameter.

If an excessively strained stack is used to form an optoelectronic structure, a defective structure may result. This strain may, in particular, cause dislocations or V-pits in the surface of the InGaN films. These defects deteriorate the functional performance of the optoelectronic structure.

The appearance of V-pits during the epitaxy of an InGaN film has been widely documented, for example, in the article by Jahnen, B. et al. "Pinholes, dislocations and strain relaxation in InGaN." Materials Research Society Internet Journal of Nitride Semiconductor Research 3 (1998), but is not yet fully understood.

In particular, it cannot be considered to be due to a Stranski-Krastanov or Volmer-Weber growth mode transition. It occurs where threading dislocations the Burgers vector of which have a component along the c-axis emerge. The critical InGaN-film thickness from which these V-pits develop decreases very rapidly with indium concentration. It is about 150 nm for compositions lower than or equal to 10% indium and barely about fifty nanometers for 15% indium.

In order to be able to produce light-emitting diodes capable of emitting in or close to the red or green domain, it would be desirable to provide, on an "island" substrate, growth islands having a lattice parameter close to the natural lattice parameter of an InGaN layer with a proportion of indium of about 40%, and, for example, between 34% and 43%. This lattice parameter could in this case be between 0.331 and 0.334 nanometer. More generally, it would be desirable to provide, on an "island" substrate, growth islands having a good crystal quality and a lattice parameter selectable from a very wide range of values, for example, between 0.321 and 0.337 nm, these values corresponding to the lattice parameters of fully relaxed InGaN with a proportion of indium between about 6% and 50%. It would then be possible to freely select the lattice parameter of the growth islands so that it is matched to the lattice parameters of the layers of various natures from which the stack forming the optoelectronic structure is formed, and, in particular, matched to the lattice parameter of the quantum-well layers of an LED active layer.

However, the relaxing method presented in the introduction has limitations that do not allow this need to be fully met.

On the one hand, for the aforementioned reasons, it is difficult to prepare a donor substrate comprising a surface layer of InGaN of good crystal quality containing a high proportion, for example, higher than 5% or 7%, of indium. This is especially true for thicker surface layers.

On the other hand, the relaxation of the growth islands is often partial, and typically between 50% and 90% of its potential. Experience shows that this degree of relaxation is, in particular, determined by the thickness of the islands: the greater this thickness, the higher the achievable degree of relaxation.

Consequently, the InGaN islands of an "island" substrate are compressively strained and their lattice parameters are lower than the lattice parameter of a perfectly relaxed InGaN layer with the same proportion of indium.

It could be sought to compensate for this by increasing the indium content in the strained surface layer of the donor substrate and/or by increasing the thickness of this layer. However, as has been seen, the growth of a surface layer having a high proportion of indium and/or a substantial thickness tends to lead to the formation of V-pits that may make it unsuitable for use.

To form a good-quality InGaN surface layer, an indium content between 5 and 7% is generally selected to form a layer of about 200 nm. These characteristics are insufficient.

Document WO2018158529 discloses a process allowing the lattice parameter of InGaN growth islands to be selected, but this process is particularly complex to implement.

In practice, it is therefore difficult to obtain an island substrate for the growth of a semiconductor optoelectronic structure having a lattice parameter exceeding 0.321 nm (corresponding to the lattice parameter of a 90% relaxed InGaN island containing 7% indium) or exceeding 0.322 nm (corresponding to the lattice parameter of a 90% relaxed InGaN island containing 10% indium) and exhibiting a good crystal quality, i.e., with sufficiently few V-pits.

The present disclosure aims to at least partially solve this problem.

BRIEF SUMMARY

With a view to achieving this aim, one subject of the present disclosure provides a process for fabricating a growth substrate comprising the following steps:
  preparing a donor substrate by forming a crystalline semiconductor surface layer on a seed layer of a carrier;
  transferring at least one portion of the surface layer to a relaxation substrate with a creep layer inserted between the donor substrate and the relaxation substrate, to form a relaxation structure;
  defining growth islands in the surface layer;
  heat treating the relaxation structure to at least partially relax the growth islands;
  the process being characterized in that the preparation of the donor substrate comprises forming the surface layer as a plurality of alternations of an InGaN primary layer and of an AlGaN secondary layer, the indium concentration and the thickness of the primary layers and the aluminum concentration and the thickness of the secondary layers being selected so that a homogeneous AlInGaN layer that is equivalent, in terms of concentration of aluminum and indium, to the surface layer has a natural lattice parameter different from the lattice parameter of the seed layer 2a.

By producing the donor substrate according to the process that has just been described, it is possible to form an AlInGaN surface layer that is thick, on the order of 200 nm or more in thickness, and that has a natural lattice parameter equivalent to that of an InGaN layer with a high proportion of indium, without the surface layer exhibiting an excessive density of V-pits.

According to other advantageous and non-limiting features of the present disclosure, which may be implemented alone or in any technically feasible combination:
  each primary layer has an indium concentration strictly higher than 0% and lower than or equal to 50% and a thickness between 10 and 150 nm;
  each secondary layer has an aluminum concentration higher than or equal to 0% and lower than or equal to 20% and a thickness between 2 and 15 nm;
  the plurality of alternations comprises between 2 and 20 alternations;
  the surface layer has a thickness greater than 200 nm;
  the process comprises a heat treatment for homogenizing the surface layer;
  the process comprises transferring the growth islands to a final carrier, a dielectric layer being inserted between the growth islands and the final carrier.

BRIEF DESCRIPTION OF THE DRAWINGS

Other features and advantages of the present disclosure will become apparent from the following detailed description of the present disclosure, with reference to the accompanying figures, in which.

DETAILED DESCRIPTION

Figure 1:
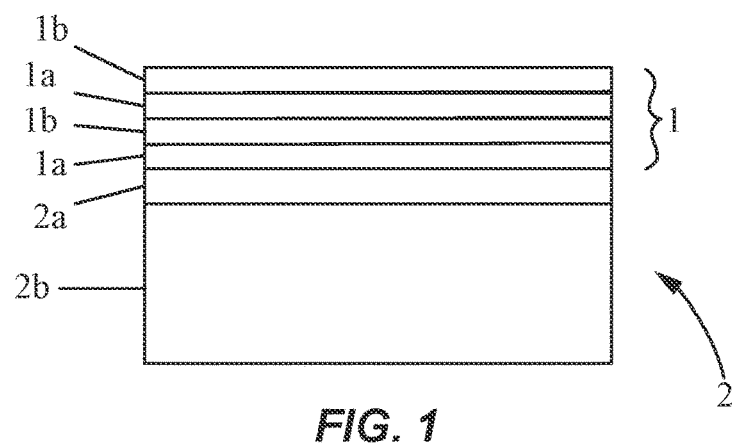
FIG. 1 shows a donor substrate according to the present disclosure.

In the present description, the aim is to prepare a donor substrate comprising a surface layer of thickness greater than 100 nm or 200 nm that has a natural lattice parameter between 0.321 and 0.337 nm and that is unlikely to generate an excessive density of defects and, in particular, V-pits. By making the assumption of complete relaxation, this possibly being approached when the layer is thick, such a layer may allow growth islands having a lattice parameter between 0.321 and 0.337 nm to be formed.

For the sake of completeness, an example of implementation of a relaxing process able to capitalize upon such a donor substrate will be given. After having formed the donor substrate, the features of which will be given in a following section of this description, a surface layer of this substrate is transferred to a relaxation substrate. A creep layer, for example, made of BPSG, is inserted between the relaxation substrate and the donor substrate. The transfer may be obtained by bonding the donor substrate to the relaxation substrate and by thinning and/or fracturing the donor substrate. A plurality of growth islands are then defined in the transferred surface layer, then the relaxation substrate, the creep layer and the islands are heat treated at a temperature above the glass-transition temperature of the creep layer, this leading to at least partial relaxation of the plurality of growth islands. The term "plurality of growth islands" designates a film formed from a set of independent and non-contiguous zones, these zones possibly being bounded by trenches that expose the creep layer or the relaxation carrier. The islands may all have sizes and/or shapes that are identical or different from one another, and have a main dimension in the plane defined by the relaxation substrate (diameter or length depending on the shape of the island) between a few microns and 1 mm. The islands may be separated from one another by trenches the width of which may be between 1 and 50 microns.

The degree of relaxation obtained at the end of the relaxing heat treatment may reach 50% to 90% of the maximum degree of relaxation corresponding to attainment of a perfectly relaxed layer. This degree of relaxation, in particular, depends on the thickness of the islands, and on the duration and the amplitude of the heat treatment.

To assist this relaxation and to avoid potential buckling of the growth islands during the plastic deformation that occurs during the relaxation, provision may be made to form a stiffening layer on the islands, before the application of the relaxing heat treatment. The degree of relaxation of an island obtained after this heat-treatment step is that which balances the strains present in the stiffening layer and in the island. It will be noted that the stiffening layer may be formed from (or comprise) a residue of the donor substrate that is preserved on the strained layer at the end of its transfer to the creep layer.

The growth islands may be defined in the semiconductor layer after the latter has been transferred to the relaxation substrate, as was described above, but, alternatively, provision could be made for the growth islands to be defined directly in the donor substrate, before their transfer to the relaxation substrate.

To form a growth substrate, the at least partially relaxed growth islands may be transferred to a final carrier using a wafer-scale layer-transfer technique comprising, for example, bonding the exposed side of the islands to the final carrier and removing the relaxation substrate and the creep layer. A bonding layer, for example, comprising at least one dielectric layer, may be provided between the islands and the final carrier, to facilitate their assembly.

The growth substrate may then be used to form semiconductor optoelectronic structures, as was recalled in the introduction to this patent application.

According to one particularly advantageous application variant, the growth substrate may serve as a carrier for a donor substrate, and therefore receive a new strained surface layer. The relaxing process may then be applied again, repeatedly, to this new surface layer.

FIG. 1 shows a donor substrate 2 according to the present disclosure comprising a crystalline semiconductor surface layer 1 the general formula of the composition of which is (Al, In, Ga)N. The term AlInGaN denotes a single-crystal layer (i.e., one obtained by epitaxial growth) formed from the atomic species aluminum, indium, gallium and nitrogen, the respective proportions x and y of aluminum and of indium complementing the proportion 1−x−y of gallium in the layer. Generally, the values x, y and 1−x−y are in the interval [0,1].

The donor substrate 2 comprises a seeding surface suitable for receiving the AlInGaN layer 1. This surface may be that of a seed layer 2a formed on a carrier 2b. The carrier 2b may consist of a wafer, for example, of sapphire, silicon or silicon carbide, and has a thickness, typically between 300 and 600 microns, that is sufficient to provide the stack formed at least from the seed layer 2a and semiconductor layer 1 with mechanical strength.

According to a first approach, the seed layer 2a may be a GaN film formed by epitaxial growth on the carrier 2b, and have a thickness between 2 and 5 microns. More generally, the seed layer 2a may comprise a stack of elementary GaN and/or AlGaN films, the aluminum composition of which varies from one elementary film to another. Preferably, the seeding layer or the elementary film providing the seeding surface has a lattice parameter in the a-plane equal to 3.189 angstroms, to within 0.005 angstrom.

According to another approach, already mentioned in a previous passage, the seed layer 2a may be a partially relaxed InGaN layer that is either continuous or made up of islands, as obtained at the end of the relaxing process described above. The lattice parameter of the lattice is on the order of 0.320 nm when the InGaN layer has a thickness on the order of 100 nm and an indium concentration lower than 5% or 7%.

Whichever approach is selected to form the donor substrate 2, the AlInGaN semiconductor layer 1, which is placed on (and in contact with) the seed layer 2a, comprises a plurality of alternations of primary and secondary layers 1a, 1b.

Each alternation therefore comprises one InGaN primary layer 1a having an indium composition strictly higher than zero and lower than 50%, and preferably lower than 15%. Its thickness is, preferably, between 10 and 150 nanometers. This thickness is selected, depending on the indium concentration that it contains, to be smaller than the critical thickness beyond which V-pits form.

Each alternation also comprises, on and in contact with the primary layer 1a, a GaN or AlGaN secondary layer 1b that therefore has an aluminum composition higher than or equal to 0 and, preferably, lower than or equal to 10%. Its thickness is, preferably, between 2 and 15 nanometers. This thickness is in all cases selected to be smaller than its critical in-plane relaxation thickness, its critical crazing thickness when the secondary layer 1b is under tensile strain, for example. In one particular embodiment, the secondary layer is an AlGaN layer and therefore comprises an aluminum concentration strictly higher than 0.

The number of alternations forming the AlInGaN semiconductor layer 1 is typically between 2 and 20. This number is selected so as to give the semiconductor layer 1 a determined thickness. In particular, it is possible to envision using more than 20 alternations to form a very thick AlInGaN layer 1. Thus, it will possibly be chosen to form an AlInGaN semiconductor layer 1 having a thickness greater than 100 nm, 200 nm, 500 nm, 1000 nm or even greater than 1500 nm.

Since the primary and secondary layers 1a, 1b remain strained, the lattice parameter of the AlInGaN surface layer 1 is substantially the same as that of the seed layer 2a, to within 0.1%. The in-plane lattice parameter may, for example, be measured by X-ray diffraction at grazing incidence.

It will be noted that the AlInGaN surface layer 1, made up of the plurality of alternations that has just been described, is equivalent to a homogeneous AlInGaN layer having the same total thickness, and the same average concentration (over the entire thickness of the layer) of indium, aluminum and gallium. According to the present disclosure, the indium concentration and the thickness of the primary layers 1a and also the aluminum concentration and the thickness of the secondary layers 1b are selected so that the equivalent homogeneous AlInGaN layer has a natural lattice parameter (i.e., in the absence of any strain) that is very different from the lattice parameter of the seed layer 2a.

In this way, a surface layer 1 that is generally strained is formed i.e., the strain energies of the primary and secondary layers from which the surface layer is formed are not in equilibrium. This overall strain may be released in the relaxing steps of the process, as has been described. Advantageously, the free lattice parameter of the equivalent homogeneous AlInGaN layer is higher than that of the seed layer 2a, so as to compressively strain the surface layer 1.

Advantage will possibly be taken of this, in particular, compressive strain in the rest of the relaxing process that has been described, to form growth islands that are at least partially relaxed and that have a freely selected lattice parameter.

The indium composition of a primary layer 1a and the aluminum composition of a secondary layer 1b, and their respective thicknesses, may vary from one alternation to another. Preferably however, for simplicity of implementation, alternations will be selected that have primary and secondary layers 1a, 1b that are identical, in particular, with regard to the indium and aluminum concentration.

As will be explained in more detail below, in relation to the detailed description of its fabricating process, the semiconductor layer 1 has a V-pit density that is very low, lower than or equal to $10^7$ cm$^2$, or even $10^6$ per cm$^2$. In addition, these defects have a size, i.e., the width of the opening on the surface onto which they emerge, smaller than 200 nm or 100 nm.

The V-pit density and size may be determined by observing a segment of the surface of the semiconductor layer 1, for example, using an atomic force microscope or a scanning electron microscope. In the segment observed by microscope, which may, for example, correspond to a square field of 20 microns side length when atomic force microscopy is used, the number of visible defects that have a size in the observation field larger than 10 nm, and which will be considered to be V-pits, is counted. The count and the size of the field are then used to determine the defect density.

Moreover, in the context of the present application, a layer will be considered not to contain any V-pits if no defects having a size in the observation field larger than 10 nm are counted, when this observation field has a size of at least 900 µm$^2$ (for example, a square field of observation with a side length of 30 microns).

Thus, the critical thickness of the primary layer 1a beyond which V-pits form may be easily established, for a given indium concentration, by determining through experimentation the thickness beyond which at least one V-pit is observed in an observation field of 900 µm$^2$. Similar observations of the secondary layer 1b allow, for a given aluminum concentration, the critical thickness beyond which relaxation of the layer may cause it to craze to be determined very easily.

The stated features of the AlInGaN surface layer 1 are noteworthy in that its thickness may exceed the critical thickness at which, with a homogeneous InGaN film of similar natural lattice parameter, a high density of V-pits, generally having a substantial size larger than 200 nm, would be observed. It is therefore possible to form a surface layer 1 liable to be able to provide, once relaxed, islands having a good crystal quality, and a lattice parameter and thickness greater than what it is possible to obtain with an InGaN surface layer of 100 nm and containing 5% or 7% indium. It is, in particular, possible to select the parameters of the surface layer so that the islands have a lattice parameter, after the relaxing heat treatment, indeed between 0.321 and 0.337 nm.

It will be noted that diffusion of species, which may occur between the primary and secondary layers 1a, 2a, or between the alternations, may lead to the interfaces defining these layers being degraded. Furthermore, exposure of the AlInGaN surface layer 1 to a relatively high temperature during or after its formation may promote the diffusion of these species and lead to the formation of a surface layer 1 that is homogeneous in composition. Thus, a surface layer 1 according to the present disclosure may be homogeneous in aluminum and indium concentration and have a V-pit density lower than or equal to $10^7$ per cm$^2$ or than $10^6$ per cm$^2$. Moreover, these defects may be smaller than 100 nm or 200 nm in size.

Figure 2A:
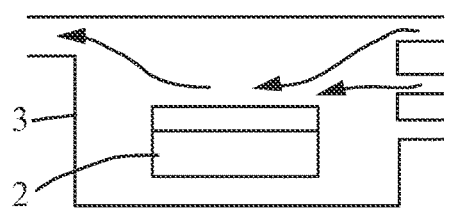
FIG. 2a shows a first step of a process for fabricating a donor substrate.
Figure 2B:
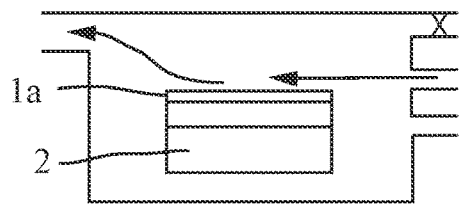
FIG. 2b shows another step of a process for fabricating a donor substrate.
Figure 2C:
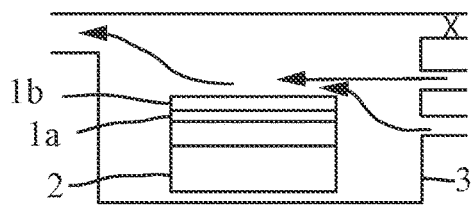
FIG. 2c shows a second step of a process for fabricating a donor substrate.
Figure 3A:
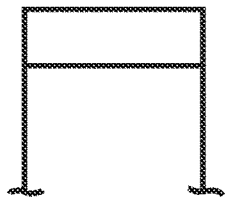
FIGS. 3a-3f illustrate a known prior art process for forming at least partially relaxed crystalline growth islands on a carrier.
Figure 3B:
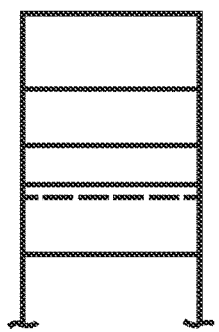
Figure 3C:
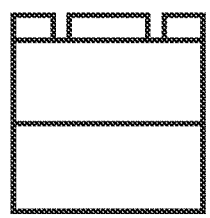
Figure 3D:
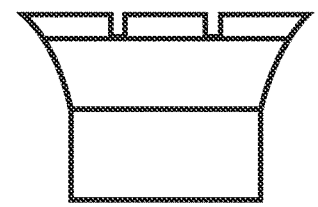
Figure 3E:
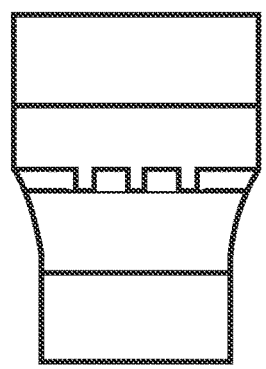
Figure 3F:
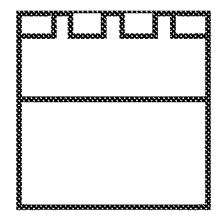

With reference to FIGS. 2a to 2c, a process for producing the AlInGaN semiconductor layer 1 on the donor carrier 2 will now be described.

The donor carrier 2 is placed in a deposition chamber of an epitaxial reactor 3, and the InGaN primary layer 1a is formed by epitaxy from precursors comprising an indium precursor.

This first step is continued, for the required time, under the selected conditions with respect to temperature, pressure and flow rate of the precursors, so that the primary layer 1a has a thickness, at the end of this step, smaller than the critical thickness at which V-pits form. As has been seen, this critical thickness is dependent on the proportion of indium in the layer and the thickness of the primary layer is therefore selected from the aforementioned range. Once this thickness has been reached, the supply of the indium precursor to the chamber is interrupted, then, in a second step, the secondary layer 1b is formed by epitaxy in the aforementioned thickness and concentration ranges directly on the primary layer 1a.

In this second step, precursors, in particular, comprising an aluminum precursor are supplied, as is well known per se. This step is continued under the conditions with respect to temperature, pressure and flow rate of the precursors to form a secondary layer 1b having a thickness smaller than its relaxation thickness.

The first and second steps that have just been described are then repeated until an AlInGaN surface layer 1 of defined thickness, composed of a plurality of alternations, is obtained.

The AlGaN secondary layer 1b allows the InGaN primary layer 1a to be stabilized and the emergence of V-pits, during growth, to be prevented or limited. This stabilization effect is promoted by judiciously choosing the epitaxial growth parameters used in the first and second steps.

Thus, the epitaxial growth conditions of the second step (its temperature, its pressure and the flows of precursors) will be selected so that they promote the desorption of the indium atomic species present on the surface of the primary layer 1a. Specifically, it would appear that the removal of indium from the surface of the primary layer 1a, and from a small thickness under this surface, promotes the stabilization effect that leads to the lower V-pit density. To promote this, the growth conditions will preferably be selected so that the first step is carried out at a first temperature below the selected second growth temperature in the second step.

It will also be ensured that the primary layer 1a has a low surface roughness, this low roughness also limiting the appearance of V-pits. This may be done by starting the growth of the secondary layer 1b under epitaxial conditions that promote smoothing of the exposed surface of the primary layer 1a. To achieve this, the pressure of the atmosphere of the epitaxy chamber in the second step (the second pressure) may be chosen so that it is lower than the pressure in the chamber in the first step (the first pressure).

As seen above, provision may also be made, in or at the end of one of the steps of the process, for an additional step in which a homogenizing heat treatment is carried out to homogenize the atomic species from which the primary layer 1a and the secondary layer 1b are made. It may be a question of a heat treatment carried out in situ in the reactor 3, or outside it in a piece of equipment dedicated to heat treatments. The atmosphere of the homogenizing heat treatment may be an inert or reducing atmosphere, in particular, ammonia, the temperature may be between 800 and 1100° C., and it may last longer than 1 hour.

The first and second epitaxy steps may be implemented using the very conventional techniques metal-organic chemical vapor deposition (MOCVD), or molecular beam epitaxy (MBE). In MOCVD, the precursors consist of gas that flows through the chamber. In MBE, these precursors are extracted from a solid source as is well known per se.

Besides the necessary presence of precursors of the atomic species aluminum, indium, gallium and nitrogen from which the primary and secondary layers 1a, 1b are made, provision may be made for flows of other gases or to provide other solid sources in the chamber, for example, to dope the layers, in particular, with Si or Mg. In particular, silicon may be integrated into the primary or secondary layer, in a concentration between $10^{17}$ and $10^{19}$ per $cm^3$ to introduce tensile strain into the layers.

By way of example, a stack of layers was produced in a MOCVD epitaxy reactor on a donor substrate 2 comprising a transferred InGaN seed film having a proportion of indium of 0.05 and having a lattice parameter in the a-plane of 3.205 angstroms. The seed film rested on a sapphire carrier. The stack forming the surface layer 1 comprised a repetition of 8 alternations of $In_{0.08}Ga_{0.92}N$ films (proportion of indium of 0.08) of 90 nm thickness and of 7 $Al_{0.03}Ga_{0.97}N$ films (proportion of aluminum of 0.03) of 9 nm thickness. This alternating repetition led to the formation of a semiconductor layer of about 800 nm, equivalent to a homogeneous InGaN layer of the same thickness having an indium concentration of 7.4%.

This structure exhibited no crazing or V-pits in a field of 1000 $\mu m^2$ observed by atomic force microscope, leading it to be concluded that that it had a V-pit density lower than $10^5$ per $cm^2$. It was pseudomorphic, i.e., the in-plane lattice parameter of the seed film was preserved during growth.

The critical thickness of V-pit formation for films of $In_{0.08}Ga_{0.92}N$ was estimated to be smaller than about 150-200 nm. The thickness of the primary layer 1a of each alternation was smaller than this value while the cumulative thickness of the semiconductor layer was much greater than this value.

The biaxial in-plane tensile strain of the secondary layers of $Al_{0.03}Ga_{0.97}N$ was about 3.2 GPa. The critical crazing thickness was about 90 nm for this strain value. The thickness of each alternation of $Al_{0.03}Ga_{0.97}N$ was smaller than this value.

The growth conditions of the InGaN primary layers (8% indium, 90 nm thick) were 850° C., 300 torr, a molar flow rate of TMin of 105 µmol/min, a molar ratio TMIn/(TMin+TEGa) of 73%, a V/III molar ratio of 3661, a 70% NH3/30% N2/0% H2 mixture of the input hybrid gases (NH3, H2, N2).

The growth conditions of the AlGaN secondary layers (3% aluminum, 9 nm) were 950° C., 75 torr, a molar flow rate of TMGa of 23 µmol/min, a TMA1/(TMGa+TMA1) molar ratio of about 3%, a V/III molar ratio of 3400 and a 10% NH3/80% N2/10% H2 mixture of the input hydride gases.

The transition between the first and second epitaxy steps took place with the flow rate of gaseous ammonia maintained, but with the flow of organometallics stopped, and, in particular, with the flow of the indium precursor gas stopped. The ramp in temperature, pressure and flow rate of the hydride gases (NH3, H2, N2) lasted 90 secs and was then followed by a stabilizing step of 30 secs.

By way of complementary example, the following stack of layers allowed an (Al,In,Ga)N surface layer 1 of about 250 nm thickness with a "natural" in-plane lattice parameter equal to 3.238 angstroms to be obtained.

The carrier substrate consisted of a GaN seed layer 2a having a thickness of about 3 micrometers and having a lattice parameter in the a-plane of 3.185 angstroms. The seed film was formed by epitaxy on a sapphire carrier 2b.

A repetition of 8 alternations of $In_{0.15}Ga_{0.85}N$ films 1a (proportion of indium 0.15) of 30 nm thickness and 7 $Al_{0.03}Ga_{0.97}N$ films 1b (proportion of aluminum of 0.03) of 2 nm thickness was formed. This alternating repetition led to the formation of a semiconductor layer of about 250 nm.

By producing the donor substrate according to the process that has just been described, it is possible to form an AlInGaN surface layer that is thick, of the order of 200 nm or more in thickness, and that has a natural lattice parameter equivalent to that of an InGaN layer with a high proportion of indium, for example, 6%, 10% or indeed even 30%, without the surface layer exhibiting an excessive density of V-pits.

Such a semiconductor layer, after having been subjected to the relaxing process described at the start of this detailed description, is able to form $In_xAl_yGa_{(1-x-y)}N$ growth islands that have the same good crystal quality (for example, a V-pit density lower than or equal to $10^7$ per $cm^2$), and advantageously a thickness greater than or equal to 200 nm and therefore liable to promote the relaxation effect. The proportion x of indium may be between [0,1] and the proportion y of aluminum may be between [0,1]. Advantageously, the proportion x of indium is between [0.1[and the proportion y of aluminum is between]0,1]. The growth islands may be homogeneous in aluminum and indium concentration or have the alternation of primary and secondary layers 1a, 1b of the surface layer 1 from which they are made.

The lattice parameter of these $In_xAl_yGa_{(1-x-y)}N$ growth islands may thus be between 0.321 and 0.337 nm. As has been seen, these islands may be placed on a final carrier, at least one dielectric layer being inserted between the final carrier and the crystalline semiconductor growth islands.

Of course, the present disclosure is not limited to the described mode of implementation and modifications may be made thereto without departing from the scope of the invention such as defined by the claims.

The invention claimed is:

1. A method for fabricating a growth substrate comprising the following steps:
   preparing a donor substrate by forming a crystalline semiconductor surface layer on a seed layer of a carrier, the crystalline semiconductor surface layer comprising a plurality of alternations of an InGaN primary layer and an AlGaN secondary layer, an indium concentration and a thickness of the primary layers and an aluminum concentration and the thickness of the secondary layers being selected so that a homogeneous AlInGaN layer that is equivalent, in terms of concentration of aluminum and indium, to the surface layer has a natural lattice parameter different from the lattice parameter of the seed layer;
   transferring at least one portion of the surface layer to a relaxation substrate with a creep layer between the donor substrate and the relaxation substrate, to form a relaxation structure;
   defining growth islands in the surface layer; and
   heat treating the relaxation structure to at least partially relax the growth islands.

2. The method of claim 1, wherein each primary layer has an indium concentration higher than 0% and lower than or equal to 50% and a thickness between 10 and 150 nm.

3. The method of claim 2, wherein each secondary layer has an aluminum concentration higher than or equal to 0% and lower than or equal to 20% and a thickness between 2 and 15 nm.

4. The method of claim 3, wherein the plurality of alternations comprises between 2 and 20 alternations.

5. The method of claim 4, wherein the surface layer has a thickness greater than 200 nm.

6. The method of claim 5, further comprising a heat treatment for homogenizing the surface layer.

7. The method of claim 6, further comprising transferring the growth islands to a final carrier, a dielectric layer being located between the growth islands and the final carrier.

8. The method of claim 1, wherein the plurality of alternations comprises between 2 and 20 alternations.

9. The method of claim 1, wherein the surface layer has a thickness greater than 200 nm.

10. The method of claim 1, further comprising a heat treatment for homogenizing the surface layer.

11. The method of claim 1, further comprising transferring the growth islands to a final carrier, a dielectric layer being located between the growth islands and the final carrier.

* * * * *